United States Patent [19]

Dean et al.

[11] 4,330,769
[45] May 18, 1982

[54] SINGLE ELECTRODE SENSE CIRCUIT FOR CHARGE-COUPLED TRANSVERSAL FILTERS

[75] Inventors: Ralph T. Dean, Richardson; David A. Sealer, Dallas; James R. Hellums, Carrollton, all of Tex.

[73] Assignee: Mostek Corporation, Carrollton, Tex.

[21] Appl. No.: 119,578

[22] Filed: Feb. 7, 1980

[51] Int. Cl.$^3$ ............... H03H 15/02; G11C 19/28; H03K 5/156

[52] U.S. Cl. .................. 333/165; 307/221 D; 333/166

[58] Field of Search .............. 333/165, 166, 173; 328/167, 151; 357/24; 307/221 R, 221 C, 221 D; 364/825, 826, 864

[56] References Cited

U.S. PATENT DOCUMENTS 4,232,279 11/1980 Prince .................. 307/221 D X

OTHER PUBLICATIONS

Weckler et al., "Fully-Integrated CTD Filter with Output Sensing", 1978 IEEE International Solid-State Circuits Conference, Session VIII, Feb. 15, 1978, (Digest of Technical Papers) pp. 84-85.

Sequin et al., "Self-Contained Charge-Coupled Split-Electrode Filters Using a Novel Sensing Technique", IEEE Journal of Solid-State Circuits, vol. SC12, No. 6, Dec. 1977, pp. 626-637.

Baertsch et al., "The Design and Operation of Practical Charge-Transfer Transversal Filters", Reprinted from IEEE Trans. Electron Devices, vol. ED-23, Feb. 1976, pp. 131-141.

*Primary Examiner*—Marvin L. Nussbaum

[57] ABSTRACT

A charge coupled device transversal filter having split electrodes each having a sense portion and a complementary dummy portion. All electrode sense portions are coupled to a single sense line and all dummy portions are connected to a reference voltage. Tap weights are determined by relative lengths of successive sense portions and weighted samples are taken by shifting charge packets from one sense electrode position to a second while sensing the difference in displacement charge induced in successive sense electrodes. The structure is less sensitive to manufacturing tolerances than earlier structures and provides a sense signal with essentially no common mode component to a sense amplifier.

20 Claims, 5 Drawing Figures

SINGLE ELECTRODE SENSE CIRCUIT FOR CHARGE-COUPLED TRANSVERSAL FILTERS

BACKGROUND OF THE INVENTION

The present invention relates to charge coupled device transversal filters and more particularly to an improved electrode arrangement and sensing process in which tap outputs are generated at the time of transfer of charge packets between successive sense wells with all sensing being performed by a single electrode.

References known to the present applicants and believed to be relevant to the present invention include the article entitled "The Design and Operation of Practical Charge-Transfer Transversal Filters" by Baertsch, et al., IEEE Trans. Electron Devices, vol. ED-23, pp. 133-141, February 1976; the article entitled "Self-Contained Charge-Coupled Split-Electrode Filters Using a Novel Sensing Technique" by Sequin, et al., IEEE Journal of Solid State Circuits, vol. SC-12, No. 6, pp. 626-632, December 1977; and the article "Fully Integrated CTD Filter With Output Sensing" by Weckler, et al., printed in the Digest of Technical Papers, pp. 84 and 85, 1978 IEEE International Solid State Circuits Conference.

Both the Baertsch and Sequin references discuss conventional charge coupled device transversal filters employing split electrodes. In the devices taught by both of these references, weighting of the various signal taps is provided by the difference in length of the two portions of a single electrode. Such an arrangement has several basic problems both in processing and in signal recovery. This type of device is sensitive to mask alignment and other processing variables such as over etching of the gate patterns. Thus, normal variations in etching will have larger percentage effects on the small segment of a split electrode than it will have on the large segment, thus changing the apparent difference in length. Mask misalignment which reduces the effective length of one portion of a split electrode simultaneously increases the effective dimension of the other portion with the result that the ratio of sizes is affected by an even higher percentage. These two references also provide several different sensing amplifier schemes, all of which recognize that the output signals from the split sense amplifiers have large common mode components with the signal being only a small percentage of the common mode signal. As a result, amplifiers having extremely high common mode rejection must be employed or additional amplifiers must be employed to remove the common mode component of the output leaving only the actual signal component to be processed by a sensing amplifier. The amplifiers employed are generally of the integrating amplifier variety comprising an operational amplifier with an integrating feedback capacitor. These feedback capacitors must be large enough to absorb the large common mode signal and thus must be many times larger than would be required for capacitors used to detect only the desired signal portion of the output.

Whereas, in FIG. 9 of the Baertsch reference, multiple amplifiers are used to clamp the split electrode segments at a fixed voltage to avoid what is termed "cross talk" among the charge samples, additional difficulties with the feed-back capacitors are encountered. In particular, the clamping amplifiers must be provided with feed-back capacitors which are not only quite large, but are matched within a fraction of a percent since any difference appears as an error in the signal output which is the difference between the output of the two clamping amplifiers. It is well known that large capacitor values must be avoided in such integrated circuits and the need for very close matching of two large capacitors in the same circuit makes the arrangement basically impractical.

Other sensing schemes such as shown in FIG. 13 of Baertsch operate with a single amplifier, but face a common mode range problem and the cross talk problem mentioned above. The common mode signal detracts from signal range since actual signal is measured relative to some reference level. Again, the two capacitors provided with the amplifier must be closely matched to maintain resolution and must be large enough to minimize loss in charge handling capability, but not so large as to unduly increase insertion loss.

The Sequin reference provides some different sensing schemes, but they also require large capacitors to absorb the background charge. The Sequin arrangements are also rather complex.

The Weckler reference teaches an analog filter constructed with a bucket brigade type device, as opposed to a charge coupled device, in which only one portion of each split electrode is connected to a single sense line. As noted in this reference, this arrangement improves tap weight accuracy and eliminates large common mode signals since the signal differencing actually occurs within the single sense electrode. It is stated in this reference that it is possible, in a bucket brigade structure, to sense simultaneously the signal under both clock phases with a common sense line as shown in the figures of that article. The device further employs a single reset operational amplifier integrator for sensing displacement currents which flow in the sense gates and are summed in the output line. Weighting coefficients are implemented as the difference in areas of adjacent sense gates which correspond to the two different clock phases employed in transferring charge between the buckets of the bucket brigade device. The integrator is reset on alternate clock phases and is allowed to integrate during one of the two transitions between clock phases. Since the sense electrodes are reset at a time when signal charge is present and the same charge is present, under different electrodes, at the time a reading is taken, the background or common mode portion of the output is effectively eliminated and only the difference resulting from tap weights appears as the signal.

SUMMARY OF THE INVENTION

Accordingly, an object of the present invention is to provide an improved CCD transversal filter.

Another object of the present invention is to provide a CCD filter in which sense portions of all sense electrodes are connected to a single sense line for an integration cycle.

Yet another object of the present invention is to provide a CCD filter in which tap weights are determined by differences in length of successive sense electrodes rather than differences in length of portions of a single split electrode.

Yet another object of the present invention is to provide a CCD filter in which a single integrating amplifier may be employed for providing output signals.

A charge coupled device filter according to the present invention comprises a semiconductor substrate having an extended active region for transfer of charge packets along a first axis and a number of transverse split electrodes each having a sense portion and a complementary dummy portion overlying the active region. All sense portions are coupled to a common sense line and all dummy portions are connected to a source of reference voltage. Shifting gates are provided between the split electrodes for sequentially transferring charge packets between sense wells defined by each of the split electrodes. Additional circuitry is provided for charging the sense line to the reference voltage and then sensing the net displacement charge induced in the sense portions of the split electrodes which results from a single transfer of charge packets between successive sense wells.

In one preferred form two split electrodes and corresponding sense wells are provided for each signal charge packet so that alternate sense wells are empty. Resetting occurs as the charge packets are shifted under a first of each pair of the split electrodes and integration occurs as the packets are transferred to a second of each pair of sense wells.

In an alternate form of the invention, signal charge packets are provided for each split electrode and corresponding sense well. Resetting occurs at the end of each clock cycle and charge integration occurs upon each transfer of charge packets between successive sense wells. Tap weights are again determined by relative dimensions of each adjacent pair of sense electrodes.

BRIEF DESCRIPTION OF THE DRAWINGS

The present invention may be better understood by reading the following detailed description of the preferred embodiments with reference to the accompanying drawings wherein.

DESCRIPTION OF THE PREFERRED EMBODIMENTS

Figure 1:
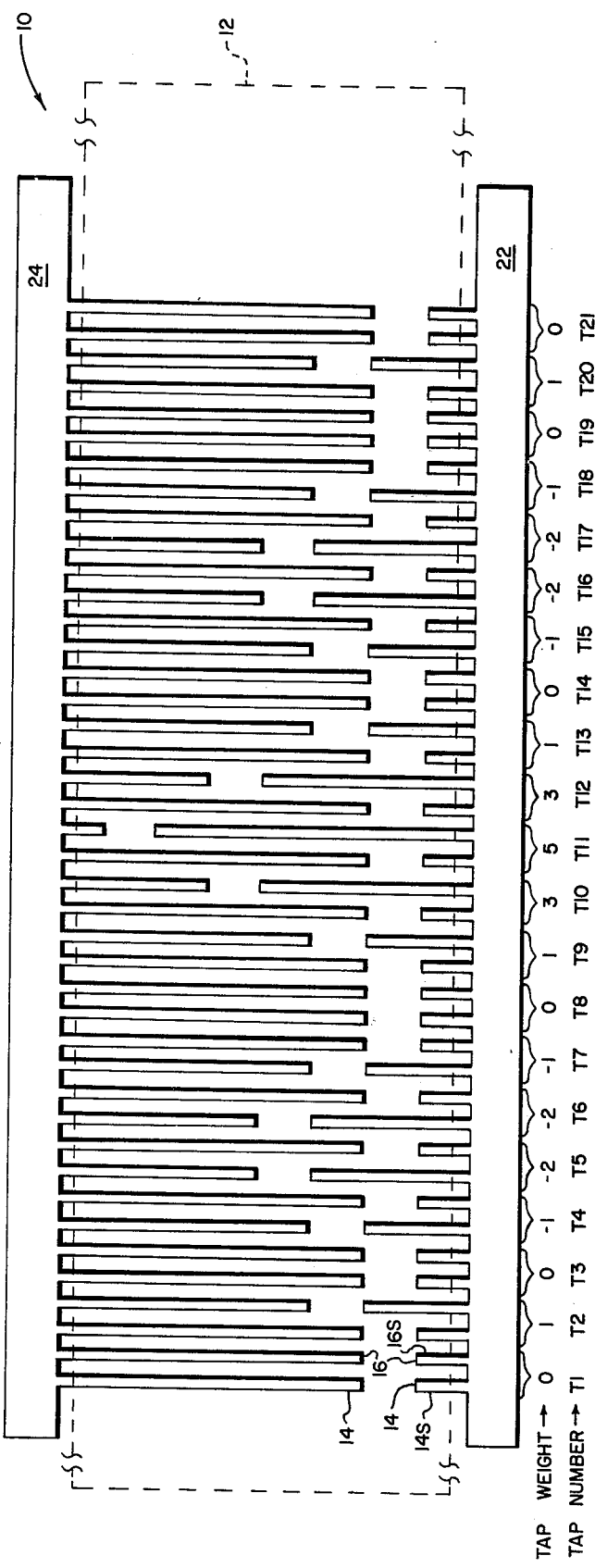
FIG. 1 is a plan view of a split electrode pattern for a charge coupled device transversal filter according to the present invention.

With reference now to FIG. 1, there is illustrated in plan view a split electrode pattern, generally designated 10, for a charge coupled device transversal filter according to a first embodiment of the present invention. This pattern may be formed in a conventional MOS process as part of the gate structure in a conventional manner. The pattern is formed on a semiconductor substrate at least partially over an active region generally defined by the dotted line 12 along which charge packets may be transferred, for example, from left to right in the figure between successive wells defined by the various electrodes. Transfer or clocking electrodes are provided between the sense electrodes illustrated in FIG. 1 for accomplishing the transfer of charge between the adjacent sense wells in a conventional manner which will be described more particularly with respect to FIGS. 2 and 3. The clocking electrodes are not shown in FIG. 1 to avoid the confusion which would otherwise occur.

A first row of numbers positioned along the lower side of the pattern in FIG. 1 indicates tap weights assigned to each of the twenty-one taps defined by the pattern of FIG. 1. A second row of numbers, T1 through T21, provides designation numbers for the twenty-one taps embraced by the twenty-one brackets. Thus, tap T1 is defined by the pair of split electrodes designated 14 and 16 on the left side of the pattern. The number "0" below this first tap corresponds to the weight assigned to tap T1. The weight assignment corresponds to the difference in length between the lower portions of the split electrodes 14 and 16 which comprise the sense portions of these electrodes and are designated 14S and 16S. Since the sense electrode portions 14S and 16S are of the same length, the weight of this tap is zero as indicated.

Tap T2 has a right sense portion which is one unit longer than the left sense portion and therefore has a weight of "1" as indicated in the drawing. Tap T5 has a left sense portion which is two units longer than the right sense portion and therefore has a weight of minus two as indicated. All of the remaining taps likewise have tap weights as indicated on the drawing which are achieved physically by the difference in length between the two sense portions of the two split electrodes defining the particular tap. This example is quite simple both in terms of the number of taps and assigned tap weights to aid in understanding the present invention.

The assignment of tap weight polarity may be somewhat arbitrary as long as it is consistent. The polarities assigned in the drawings correspond to the actual polarities of signals which are induced on the sense line 22 by the various taps. The integrators shown in FIGS. 2, 3, and 4 add an inversion to the signal levels which appear at the filter output.

In this embodiment each of the sense portions of the split electrodes, such as electrodes 14 and 16, are connected to a sense line 22. In similar fashion, each of the complementary dummy portions of each of the split electrodes is connected to a dummy or balancing line 24 which is tied to a reference potential, for example ground.

Figure 2:
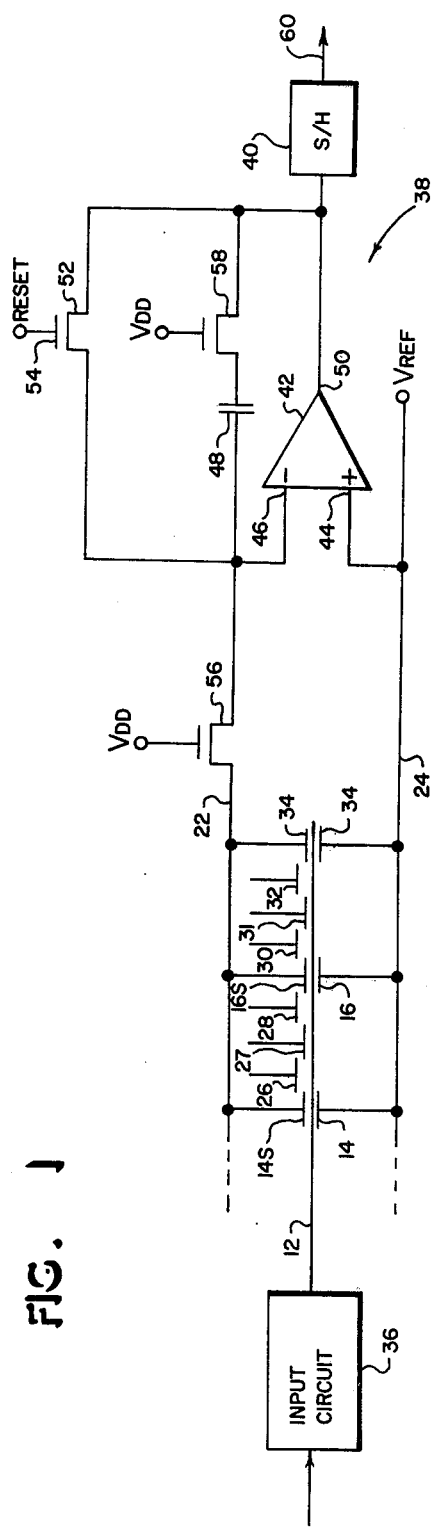
FIG. 2 is a schematic illustration of a portion of the transversal filter of FIG. 1 and of the resetting and sensing amplifier circuitry for providing output signals from the filter of FIG. 1.

With reference now to FIG. 2, a schematic illustration of a charge coupled device transversal filter according to the FIG. 1 embodiment and including portions of the sense electrode pattern of FIG. 1 is provided. In particular, portions of the sense line 22 and dummy line 24 are illustrated together with the split electrodes 14 and 16 defining tap T1. Also illustrated is a set of three clocking or shifting gates or electrodes 26, 27 and 28 positioned between the split electrodes 14 and 16. A similar set of clocking electrodes 30, 31 and 32 is provided between the split electrode 16 and a split electrode 34 which is the left electrode of tap T2 of FIG. 1.

In FIG. 2, the active region 12 of FIG. 1 is indicated by the line 12 passing between the split electrodes and adjacent the clocking electrodes. An input circuit 36 is also provided for converting an analog input signal into charge packets to be transferred along the active region 12. Although any number of input circuits may be employed with the present invention, it is preferred to employ an arrangement which will provide a surface potential which is a linear function of the input signal. Such a circuit is described in the above Sequin reference.

Output circuitry for the FIG. 1 embodiment comprises an integrating circuit generally designated 38 and a sample and hold circuit 40. The integrating circuit 38 comprises an operational amplifier 42 having a positive or non-inverting input 44 connected to a source of a reference potential and an inverting input 46 coupled to the sense line 22. An integrating capacitor is connected between an output 50 and the input 46 of amplifier 42. A resetting switch 52 is also connected between the output 50 and the input 46 of amplifier 42 in parallel with the capacitor 48. As indicated in the drawing, switch 52 is preferably a MOS transistor having a gate 54 connected to a source of a reset signal.

Also provided in the FIG. 2 embodiment are resistive elements 56 and 58 each comprising an MOS transistor having its gate tied to the positive voltage supply. The resistor element 56 couples the sense line 22 to the inverting input 46 of amplifier 42. Resistive element 58 couples one side of capacitor 48 to the output 50 of amplifier 42. The resistive elements 56 and 58 may be necessary to ensure stability of circuit 38 when a relatively high gain amplifier 42 is employed. The resistive elements are generally not needed if amplifier 42 has a gain less than 300 and generally are needed when the gain is in excess of 1,000. Stability of amplifier 42 is dependent upon the particular amplifier design and the level of capacitive loading provided by the integrating capacitor 48, the sense line 22, and parasitic capacitance.

The sample and hold circuit 40 may be basically conventional and simply operates to store the voltage at the output 50 of amplifier 42 at the end of each integration cycle. The circuit 40 therefore provides a constant output signal from the filter at an output 60 during the resetting cycles of the integrating amplifier 38.

With reference now to FIGS. 1 and 2, the operation of this first embodiment of the present invention will be described. At the start up of the circuit it can be presumed that each sense well defined by each of the split electrodes, that is two per tap, contains no charge. On a first clock cycle the input circuit 36 injects a charge packet into the first sense well defined by the split electrode 14 and the active region 12. At this point, no charge resides in the sense well defined by electrode 16. During this transfer a reset signal is applied to the switch 52 shorting the output 50 to the input 46 of amplifier 42. Since input 44 of amplifier 42 is connected to the reference source, the sense line 22 is driven by amplifier 42 to the reference voltage level at which the dummy line 24 is continuously held. Once the sense line 22 has stabilized at the reference voltage, the reset signal is removed allowing the sense line to float. Clock signals are then sequentially applied to the electrodes 26 through 28 shifting the charge packet from the sense well defined by electrode 14 to the sense well defined by the electrode 16. As this charge packet is shifted, it induces a negative charge in electrode 14S and a positive charge in electrode 16S. Since in this case, the electrodes 14S and 16S are of equal size the net effect is zero induced charge on the sense line 22. It can be seen that the net induced charge is a function both of the size of the particular charge packet, which is related to the input signal level, and the difference in area of sense portions of the split electrode which overlie the active area 12. Since for this tap the weight is zero and there is no net induced charge, the integrating amplifier 38 actually provides no output signal at this point in the process. It will be noted that during the transfer of the charge packet from electrodes 14 to 16 the input circuit 36 did not provide a second charge packet to the electrode 14.

On a following clock cycle signals are applied to the transfer electrodes 30 through 32 to transfer the charge packet from electrode 16 to the split electrode 34 and simultaneously the input circuit 36 injects a second signal packet into the sense well defined by electrode 14 in active region 12. During this clock sub-cycle the reset switch 52 is again closed to charge the sense line to the reference voltage. As in the first cycle, the reset switch is then opened and appropriate clock electrodes such as electrodes 26 through 28 are activated to shift charge packets from the left electrode of each tap to the right electrode of each tap. As can best be seen in FIG. 1, the tap T2 has a weight of one unit. Therefore upon transfer of the charge packet from left to right electrodes in the second tap a net positive charge will be induced on the sense line 22. The sensing amplifier 38 responds to the charge on sense line 22 by providing a sufficient voltage at output 50 to drive a matching quantity of charge of opposite polarity onto capacitor 48 so that sense line 22 is returned to the reference voltage. As a result, at the end of the integration cycle the voltage at output 50 represents the product of the tap weight and sample value in tap T2. This signal voltage is then sampled by the sample and hold circuit 40 and provided at output 60 until the next integrated output is available from amplifier 38.

After the second integration cycle the process is repeated with a new charge packet provided by input circuit 36 and the charge packets contained in the various wells being transferred to the left electrode of the next tap on the shift register. During each transfer of charge packets, capacitive coupling between the split electrodes and the clock electrodes cause a momentary excursion away from the reference potential on the sense lines, but the reference potential is restored when the charge transfer is complete. No charge is lost because the voltage excursion is positive, that is, the well defined by the sense electrode is momentarily made deeper.

In actual practice, the signal potential in the CCD shift register is superimposed on a background or bias level. In filters which have a DC response such bias level creates an offset in the output unless compensation is added. A background CCD shift register channel may be provided in parallel with the main channel having its sense line connected to the input 46 of amplifier 38. By proper design of the background channel the effect of a bias level may be exactly cancelled or a desirable offset may be intentionally provided.

It can be seen that the charge coupled device transversal filter described above has a number of advantages over the prior charge transfer device transversal filters. The well known transfer efficiency of CCD shift registers is realized. Only a single amplifier is required to recover signal which minimizes both noise and errors. The sense line potential is maintained at a virtual ground or reference potential when the integrator output is sampled thereby eliminating interaction between wells an the common mode problem. Tap weight accuracy is insensitive to both alignment and uniform etch variations. Since any common mode signal is essentially balanced out in the sense line itself, only a single small integrating capacitor is needed and this reduces the insertion loss of the filter.

Figure 3:
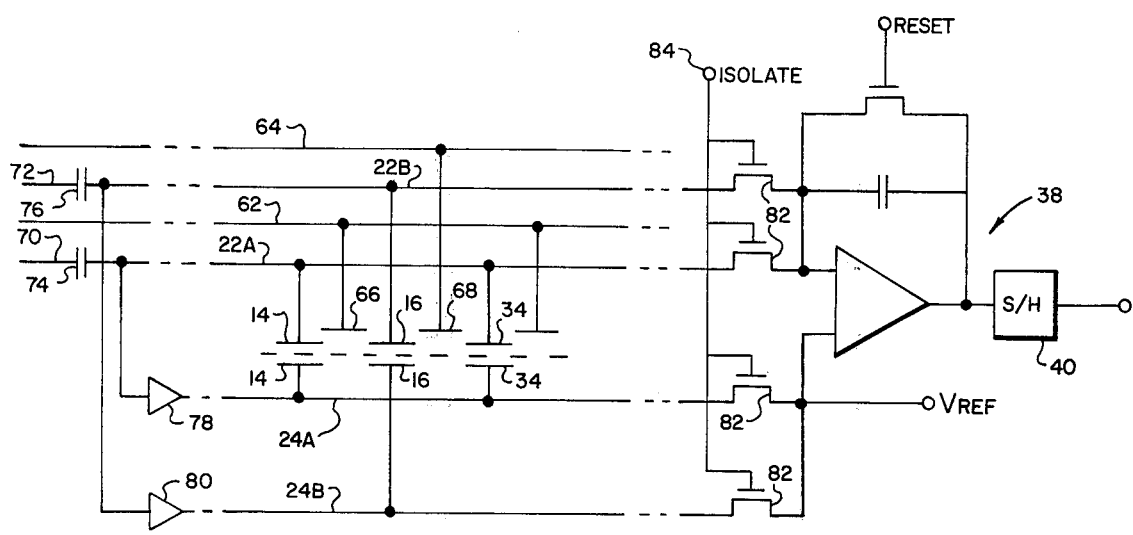
FIG. 3 is an alternate schematic diagram of charge transfer and sensing circuitry for use with the charge coupled device transversal filter of FIG. 1.

It will be noted that, in the FIG. 2 embodiment, the split or sense electrodes themselves are maintained essentially at a constant voltage and thus are not actually part of the clocking scheme. With reference now to FIG. 3 there is provided a clocking scheme utilizing only a single additional electrode between each pair of sense electrodes. Sense electrodes 14, 16 and 34 which may be the same as shown in FIG. 2 are likewise illustrated in FIG. 3. The sense line 22 has been split into two lines designated 22A and 22B to which the sense electrodes are alternately connected. Likewise the dummy line 24 is divided in two lines 24A and 24B connected to alternate split electrode dummy portions. Additional clock lines 62 and 64 are also provided connected to alternate clock electrodes 66 and 68. Clock input lines 70 and 72 are also provided and coupled by capacitors 74 and 76 respectively to the sense lines 22A and 22B respectively. A pair of buffers 78 and 80 are provided for coupling the clock signals from lines 22A and 22B to the buffer lines 24A and 24B respectively. A set of isolation switches 82 are provided for selectively disconnecting the sense lines 22A and 22B from the input 46 of amplifier 38 and the lines 24A and 24B from the source of reference potential. The gates of each of the isolation switches 82 are connected in common to an isolate input 84.

In operation, the circuitry of FIG. 3 is in many ways similar to that to FIG. 2 but only four clock phases are required for shifting of charge packets and two of the clock signals are applied to the sense electrodes themselves. When a charge packet has been injected into the sense well defined by electrode 14, both the isolate and reset switches are closed so that both sense and dummy lines are at the reference potential. The isolate and reset switches are then opened and clock signals are applied to lines 62, 64, 70 and 72 to transfer the charge packet from electrode 14 to electrode 16. The signals on lines 70 and 72 drive electrode 14 low and electrode 16 high while the signals on lines 62 and 64 hold the clock electrodes at appropriate intermediate voltages to ensure left to right shifting. The isolate switches are then closed allowing the sense and dummy lines to be returned to the reference voltage with the amplifier 38 detecting the difference in induced charge on the lines 22A and 22B which resulted from the charge transfer. After sample and hold circuit 40 has stored the amplifier 38 output, the reset switch is closed and signals on the lines 62, 64, 70, and 72 are switched to shift the charge packet from electrode 16 to split electrode 34. Once the charge packet is in the sense well defined by electrode 34, which is the first sense well of the next tap, the cycle described above is repeated.

This FIG. 3 arrangement has most of the advantages of the FIG. 2 embodiment and requires a smaller number of electrodes and clock signals. However, the coupling capacitors 74 and 76 must be relatively large and must be closely matched. In addition, the other circuitry such as buffers 78 and 80 and isolation switches 82 make this arrangement somewhat more complicated than that shown in FIG. 2. For these various reasons the FIG. 2 embodiment is preferred.

Figure 4:
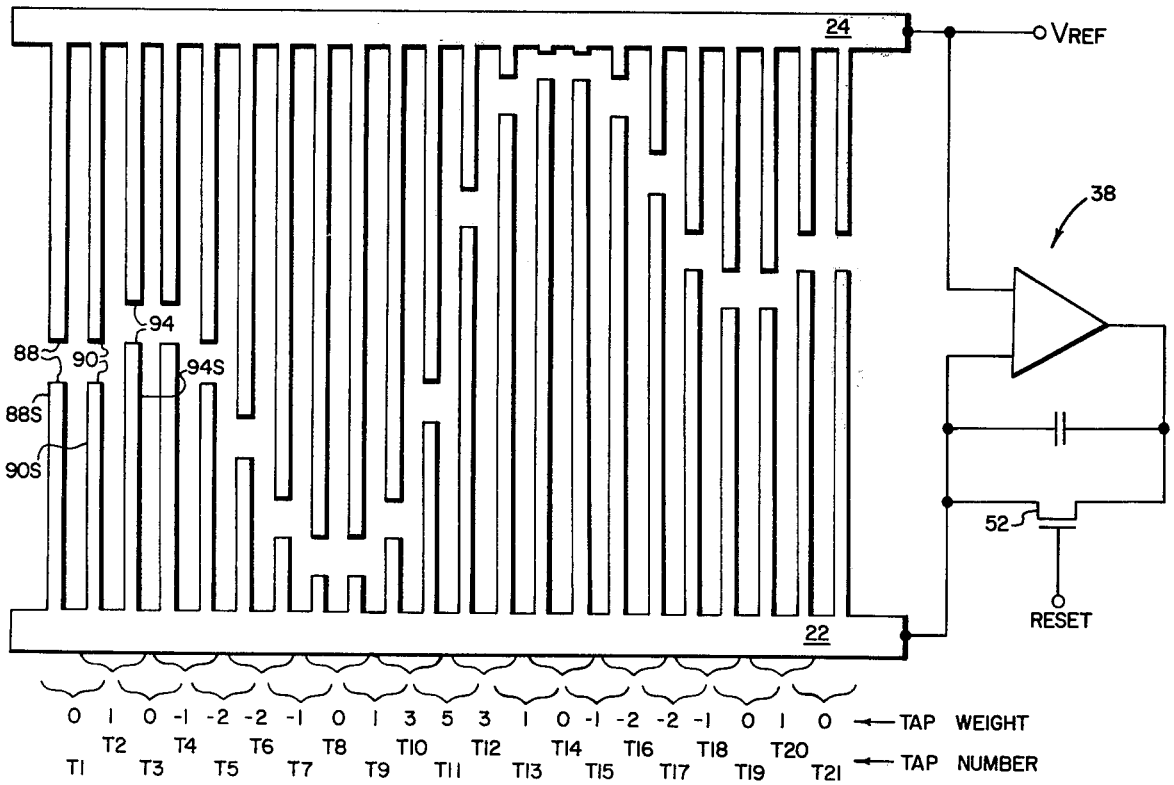
FIG. 4 is a plan view of a split electrode pattern for a second embodiment of a transversal filter according to the present invention.

With reference now to FIG. 4, there is illustrated a second embodiment of a charge coupled device transversal filter according to the present invention. The split electrode structure shown in FIG. 4 is designed to provide the same tap weight pattern provided in the FIG. 1 embodiment but with fewer electrodes. In particular, the FIG. 1 embodiment required forty-two split electrodes to provide the twenty-one taps whereas the FIG. 4 version requires twenty-two split electrodes to provide the same number of equally weighted taps. As indicated in the drawings, the FIG. 4 embodiment generally requires a wider channel for the same tap weight accuracy.

In FIG. 4, sense line 22 and dummy line 24 may be identical both physically and in external characteristics to the lines carrying the same designation numbers in FIG. 1. In similar fashion, the integrating circuit 38 may be identical to that illustrated in FIG. 2. The clocking or transfer electrode scheme may be like those shown in FIGS. 2 or 3 or any other suitable arrangement. The sense electrode structure itself is considerably different. In particular, tap T1 comprises split electrodes 88 and 90 each including sense portions designated 88S and 90S. Tap T2 includes the split electrode 90 and the split electrode 94 which includes the sense portion 94S. Thus it is seen that the split electrode 90 forms part of two different taps, T1 and T2. Each of the split electrodes in the pattern illustrated in FIG. 4, except for the first and the last, forms part of two different taps.

Operation of the FIG. 4 embodiment is quite similar to that of the earlier figures. A first signal charge packet is injected by a input circuit such as circuit 36 of FIG. 2 and transferred to a sense well defined by the sense electrode 88. The reset switch 52 is then closed so that both the sense line 22 and dummy line 24 are set at the same reference potential. The reset switch is then opened and the charge packet is then transferred from electrode 88 to electrode 90 while a second sample is injected and transferred under electrode 88. During this transfer the integrating amplifier 38 detects the displacement charges induced by the transfer of charge packets as in the earlier embodiments. The process is repeated as before, with charge packets transferred upon each clock cycle to successive sense electrodes and with a new charge packet injected upon each clock cycle rather than upon every other clock cycle as in the first embodiment. The weighting of the various taps is determined by the relative dimensions of each successive pair of sense portions of the split electrodes. Thus, since sense portion 90S is equal in length to portion 88S the first tap T1 has a zero weight. Since sense portion 94S is one unit longer than portion 90S, the second tap T2 has a weight of one unit. It can be seen that the structure generally must be wider than the FIG. 1 embodiment to achieve equal accuracy because the left or first electrode of each tap has a length determined by the tap weight of previous taps rather than a minimum optimum length. Thus, with reference back to FIG. 1 it can be seen at least one of the two sense portions forming each tap in that embodiment is of minimum length to reduce the overall capacitance of the sense line. In this FIG. 4 embodiment such minimum length sense electrodes cannot be provided in each tap. However, the reduction in overall length of the active region of approximately one-half and reduction of the total number of electrodes required to form the array can more than make up for the increased width of the active region.

Figure 5:
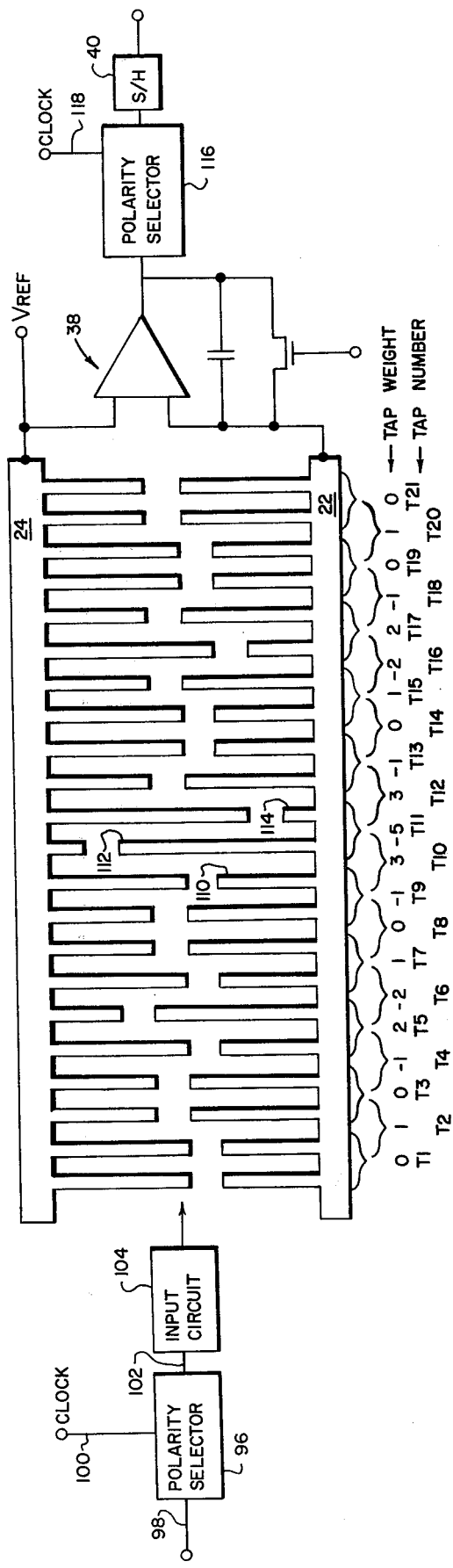
FIG. 5 is a plan view of a split electrode pattern for a charge coupled device transversal filter according to a third embodiment of the present invention and includes a schematic diagram of input and output circuitry required for use with this embodiment.

With reference now to FIG. 5, yet another embodiment of the present invention is illustrated which can have a width on the order of the FIG. 1 embodiment and a length on the order of the FIG. 4 embodiment. This embodiment again is designed to provide the same number of taps having the same tap weights as in the FIGS. 1 and 4 embodiments. The tap weights indicated in FIG. 5 will be seen to have been modified in terms of polarity, that is, every tap weight has had its sign changed. However, additional input and output circuitry has been provided in conjunction with this polarity change so that the net output result is identical to that provided in the FIGS. 1 and 4 embodiments. In particular, an input polarity selector 96 is provided having an input 98 provided for receiving the input signal and a clock input 100 for receiving signals indicating the occurrence of charge transfer within the shift register. The polarity selector 96 alternately couples the signal received on input 98 or the inverse thereof to the output 102. As a result, every other charge packet injected into the active region by input circuit 104 includes a signal portion which represents the inverse to the true sampled signal. To provide the correct sampling of the signals by the electrode array, the tap weights are also alternately inverted. Since most transfer functions are normally composed of alternate groups of positive and negative taps, this alternate inversion scheme causes the resulting tap weights to generally alternate sign. The net result is that when an electrode array is designed according to the FIG. 4 embodiment, the required width of the array is considerably less than would be required otherwise.

For example, reference to taps T10 and T11 illustrate the reduction in active area width. As in the FIG. 1 and FIG. 4 embodiments, the tap T10 carries a weight of three units and is not inverted in this embodiment. The next tap T11 would normally carry a weight of five units, but is inverted in this embodiment to a weight of minus five units. The tap T10 is realized by providing a sense portion 112 three units longer than a sense portion 110. In the earlier embodiments the tap T11 would have been achieved by providing sense portion 114 another five units longer than sense portion 112. By inverting tap T11 to a minus five, sense portion 114 is five units shorter than sense portion 112 and within two units of having the same length as sense portion 110. Corresponding reduction in split electrode length is achieved throughout the array so that the total device may have a width close to that of the FIG. 1 embodiment.

The alternate inversions of tap weights and input sample polarities as discussed above also causes the alternate inversion of output signal provided by the integrating amplifier 38. As a result, a second polarity selector 116 having a clock input 118 is provided between the integrating amplifier 38 and the sample/hold circuit 40. By clocking the selector 116 in synchronization with the input polarity selector 96 and the shifting of charge packets within the shift register itself, the overall operation of the device from input 98 to output 60 is identical with the earlier embodiments.

In the embodiments of FIGS. 4 and 5, the electrodes on each end of the pattern will cause minor errors because they form part of only one tap each. If desired, additional circuitry can be added to compensate for such errors.

While the present invention has been illustrated and described in terms of specific apparatus and methods of use, it is apparent that various modifications and changes can be made within the scope of the present invention as defined by the appended claims.

What is claimed is:

1. A charge coupled device transversal filter comprising:

a semiconductor substrate having an extended active region adapted for sequential transfer of charge packets along a longitudinal axis;

first and second split electrodes each positioned on said substrate generally perpendicular to said axis and each having a sense portion and a complementary dummy portion overlying said active region, said first and second split electrodes defining a tap having a weight corresponding to a preselected difference in length of said sense portions overlying said active region;

a sense line connected to the sense portions of said first and second split electrodes;

a dummy line connected to the dummy portions of said first and second split electrodes and to a source of a reference voltage;

means for charging said sense line to said reference voltage when a charge packet is located in a sense well defined by said first split electrode;

means for shifting a charge packet from said first sense well to a second sense well defined by said second split electrode; and integrating amplifier means coupled to said sense line for detecting the difference in displacement charges induced in said sense portions by shifting of a charge packet from said first sense well to said second sense well.

2. A transversal filter according to claim 1 further including:

a plurality of additional taps each comprising a pair of split electrodes, said additional taps positioned along said active region to sequentially receive charge packets being transferred along said region, each of said split electrodes having a sense portion coupled to said sense line and a dummy portion coupled to said dummy line.

3. A transversal filter according to claim 2, further including:

charge input means formed on said substrate adjacent one end of said active region for, upon alternate shifting of charge packets between successive sense wells, injecting a charge packet representing a signal sample into said first sense well.

4. A transversal filter according to claim 1, further including:

a third split electrode positioned on said active region adjacent said second split electrode, said third split electrode having a sense portion connected to said sense line and a dummy portion connected to said dummy line, said third split electrode defining a third sense well in said active region, said second and third split electrodes defining a second tap having a weight corresponding to a preselected difference in lengths of sense portions of said second and third electrodes overlying said active region;

means for, after detection of the difference in displacement charge induced in said sense portions by shifting of a charge packet from said first sense well to said second sense well, charging said sense line to said reference voltage; and means for shifting a charge packet from said second sense well to said third sense well.

5. A transversal filter according to claim 4, further including:

charge input means formed on said substrate adjacent one end of said active region for, upon said transfer of said charge packet from said first to said second sense well, injecting a charge packet representing a consecutive signal sample into said first sense well.

6. A transversal filter according to claim 1, wherein: said means for shifting a charge packet comprises three adjacent shifting electrodes positioned over said active region between said first and second split electrodes, a source of sequential clock signals coupled to said three shifting electrodes, and, means for maintaining the voltage of said split electrodes substantially at said reference voltage.

7. A transversal filter according to claim 1, wherein said means for shifting a charge packet comprises:
a shifting electrode positioned over said active region between said first and second split electrodes;
means for selectively disconnecting said first and second split electrode sense and dummy portions from said sense and dummy lines respectively; and
a source of multiphase clock signals coupled to said split electrodes and to said shifting electrode.

8. A method for providing a weighted sum of consecutive samples of a signal in a charge coupled device shift register comprising:
defining first and second sense wells in an active region of a charge coupled device shift register by first and second split electrodes each having a sense portion coupled to a sense line and a dummy portion coupled to a dummy line;
connecting said dummy line to a source of reference voltage;
transferring a charge packet representing a signal sample into said first sense well;
charging said sense line to said reference voltage;
shifting said charge packet from said first sense well to said second sense well; and
detecting a difference in displacement charges induced in said sense portions by shifting of said charge packet from said first to said second sense wells.

9. A method according to claim 8, wherein:
said sense line is coupled to an inverting input of an operational amplifier having a non-inverting input connected to said source of reference voltage and further having the parallel combination of a capacitor and a switching element coupled from an output to said inverting input;
the step of charging said sense line includes the closing of said switching element; and
the step of detecting the difference in displacement charges includes the opening of said switching element prior to transferring said charge from said first sense well to said second sense well.

10. A charge coupled device transversal filter comprising:
a semiconductor substrate having an extended active region adapted for sequential transfer of charge packets along a longitudinal axis;
a plurality of taps positioned along said active region, each of said taps including first and second split electrodes positioned generally perpendicular to said axis and each having a sense portion and a dummy portion overlying said active region;
a sense line connected to the sense portion of each split electrode of each tap;
a dummy line connected to the dummy portion of each split electrode of each tap and to a source of a reference voltage;
shifting means for sequentially transferring charge packets to successive split electrodes along said longitudinal axis;
charge input means for, upon alternate transfer of charge packets by said shifting means, injecting a charge packet representing a signal sample into a first sense well defined by the first split electrode of a first tap;
reset means for charging said sense line to said reference voltage when charge packets are in sense wells defined by said first electrodes;
integrating circuit means coupled to said sense line for detecting the difference in displacement charges induced in said sense portions of said taps by shifting of charge packets from sense wells defined by said first electrodes to sense wells defined by said second electrodes.

11. A charge coupled device transversal filter according to claim 10, wherein:
said shifting means includes a set of first, second and third clock electrodes positioned between each successive pair of split electrodes, and a source of sequential clock signals coupled to said clock electrodes for shifting charge packets between sense wells defined by successive split electrodes.

12. A charge coupled device transversal filter according to claim 10, wherein said shifting means includes:
a single clock electrode positioned between each successive pair of split electrodes;
means connecting alternate clock electrodes to first and second clock inputs;
isolating means for selectively disconnecting said split electrode sense portions from said sense line and selectively disconnecting said split electrode dummy portions from said source of reference potential;
coupling means for selectively connecting the sense and dummy portions of said first split electrodes to a third clock input and the sense and dummy portions of said second split electrodes to a fourth clock input; and
a source of four phase clock signals coupled to said first, second, third and fourth clock inputs.

13. A charge coupled device transversal filter according to claim 10, wherein:
said integrating circuit means includes an operational amplifier having a positive input connected to a said source of reference voltage, a negative input coupled to said sense line and a capacitor coupled between said negative input and an output of said amplifier.

14. A charge coupled device transversal filter according to claim 13, wherein said reset means includes a switch device connected between said amplifier output and a negative input for selectively shorting said output to said negative input to thereby selectively charge said negative input and said sense line to said reference voltage.

15. A charge coupled device transversal filter according to claim 13 further including a first resistive element connected in series with said capacitor between said amplifier output and negative input, and a second resistive element coupling said negative input to said sense line.

16. A charge coupled device transversal filter comprising:

a semiconductor substrate having an extended active region adapted for sequential transfer of charge packets along a longitudinal axis;

a plurality of split electrodes positioned along said active region generally perpendicular to said axis, each split electrode having a sense portion and a dummy portions overlying said active region;

a sense line connected to the sense portions of said split electrodes;

a dummy line connected to the dummy portions of said split electrodes and to a source of a reference voltage;

shifting means for sequentially transferring charge packets between sense wells defined by successive split electrodes along said longitudinal axis;

charge input means for, an each transfer of charge packets by said shifting means, injecting a charge packet representing a signal sample into the sense well defined by a first split electrode;

reset means for charging said sense line to said reference voltage at time intervals intermediate successive transfers of charge packets by said shifting means; and integrating circuit means coupled to said sense line for detecting the net displacement charge induced in said sense portions of said split electrodes during each transfer of charge packets by said shifting means.

17. A charge coupled device transversal filter according to claim 16, wherein:

said shifting means includes a set of first, second and third clock electrodes positioned between each successive pair of split electrodes, and a source of sequential clock signals coupled to said clock electrodes for shifting a charge packets between sense wells defined by successive split electrodes.

18. A charge coupled device transversal filter according to claim 16, wherein:

said integrating circuit means includes an operational amplifier having a positive input connected to said source of reference voltage, a negative input coupled to said sense line and a capacitor coupled between said negative input and an output of said amplifier.

19. A charge coupled device transversal filter according to claim 18, wherein said reset means includes a switch device connected between said amplifier output and negative input for selectively shorting said output to said negative input to thereby selectively charge said negative input and said sense line to said reference voltage.

20. A charge coupled device transversal filter according to claim 18, further including a first resistive element connected in series with said capacitor between said amplifier output and negative input, and a second resistive element coupling said negative input to said sense line.

* * * * *